(12) United States Patent
Lai et al.

(10) Patent No.: US 9,344,106 B2
(45) Date of Patent: May 17, 2016

(54) ADC CALIBRATION

(71) Applicant: TAIWAN SEMICONDUCTOR MANUFACTURING COMPANY, LTD., Hsinchu (TW)

(72) Inventors: Fang-Shi Jordan Lai, Chia Yi (TW); Kuo-Ming Wang, Hsinchu (TW); Hsu-Feng Hsueh, Tainan (TW); Cheng Yen Weng, Hsinchu (TW); Yung-Fu Lin, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/570,725

(22) Filed: Dec. 15, 2014

(65) Prior Publication Data

US 2015/0097710 A1 Apr. 9, 2015

Related U.S. Application Data

(63) Continuation of application No. 13/526,147, filed on Jun. 18, 2012, now Pat. No. 8,928,508, which is a continuation of application No. 12/844,150, filed on Jul. 27, 2010, now Pat. No. 8,223,047.

(60) Provisional application No. 61/233,049, filed on Aug. 11, 2009.

(51) Int. Cl.
  *H03M 1/10* (2006.01)
  *H03M 1/36* (2006.01)

(52) U.S. Cl.
  CPC .......... *H03M 1/1009* (2013.01); *H03M 1/1004* (2013.01); *H03M 1/365* (2013.01)

(58) Field of Classification Search
  CPC ......... H03M 1/001; H03M 1/34; H03M 1/36; H03M 1/361; H03M 1/10; H03M 1/1004; H03M 1/1009; H03M 1/1071; H03M 2201/22; H03M 2201/2208; H03M 2201/2216
  USPC .................................................. 341/120, 159
  See application file for complete search history.

(56) References Cited

U.S. PATENT DOCUMENTS

| | | | | |
|---|---|---|---|---|
| 5,861,829 A * | 1/1999 | Sutardja | ............... | H03M 1/1061 341/122 |
| 6,084,538 A * | 7/2000 | Kostelnik | ............. | H03K 5/2481 341/118 |
| 6,459,394 B1 * | 10/2002 | Nadi | .................... | H03M 1/1004 341/120 |
| 6,518,898 B1 | 2/2003 | Choksi | | |
| 6,972,701 B2 | 12/2005 | Jansson | | |

(Continued)

OTHER PUBLICATIONS

Park, Sunghyun et al., A 3.5, GS/s 5-b Flash ADC in 90 nm CMOS', IEEE 2006, Custom Integrated Circuits Conference (CICC), pp. 489-492.

*Primary Examiner* — Khai M Nguyen
(74) *Attorney, Agent, or Firm* — Hauptman Ham, LLP

(57) ABSTRACT

An analog-to-digital converter (ADC) includes a plurality of comparators connected to the ADC. The ADC further includes a plurality of switches, wherein switches connected to a corresponding comparator of the plurality of comparators are configured to alternate the corresponding comparator between normal operation and a calibration configuration. The ADC further includes at least one comparator of the plurality of comparators other than the corresponding comparator is configured for normal operation if the corresponding comparator is configured for calibration.

19 Claims, 4 Drawing Sheets

(56) References Cited

U.S. PATENT DOCUMENTS

| | | |
|---|---|---|
| 7,064,693 B1 | 6/2006 | Huang et al. |
| 7,116,260 B2 * | 10/2006 | Luh .................... H03M 1/0668 341/155 |
| 7,161,523 B1 | 1/2007 | Zortea |
| 7,262,724 B2 * | 8/2007 | Hughes .................. H03M 3/49 341/118 |
| 7,394,421 B2 | 7/2008 | Morisson |

* cited by examiner

ADC CALIBRATION

PRIORITY CLAIM

The present application is a continuation application of U.S. application Ser. No. 13/526,147, filed Jun. 18, 2012, which is a continuation of U.S. application Ser. No. 12/844,150, filed Jul. 27, 2010, now U.S. Pat. No. 8,223,047, issued on Jul. 17, 2012, which claims priority of U.S. Provisional Application No. 61/233,049 filed Aug. 11, 2009, all of which are incorporated herein by reference in their entireties.

FIELD

This disclosure is generally related to ADCs (analog-to-digital converters). In various embodiments the ADC is calibrated in the background.

BACKGROUND

ADCs (analog-to-digital converters) frequently require calibration. An approach records the differential programmable current through a DAC to compensate for the comparator's output voltage offset at power-on. This recorded current value is then used to calibrate the comparator as needed. As time elapses, however, temperature and/or voltage variation can cause the threshold voltage of transistors in the ADC to change and the output voltage offset to drift, resulting in inaccurate calibration.

BRIEF DESCRIPTION OF THE DRAWINGS

The details of one or more embodiments of the disclosure are set forth in the accompanying drawings and the description below. Other features and advantages of the disclosure will be apparent from the description, drawings, and claims.

Like reference symbols in the various drawings indicate like elements.

DETAILED DESCRIPTION

Figure 1:
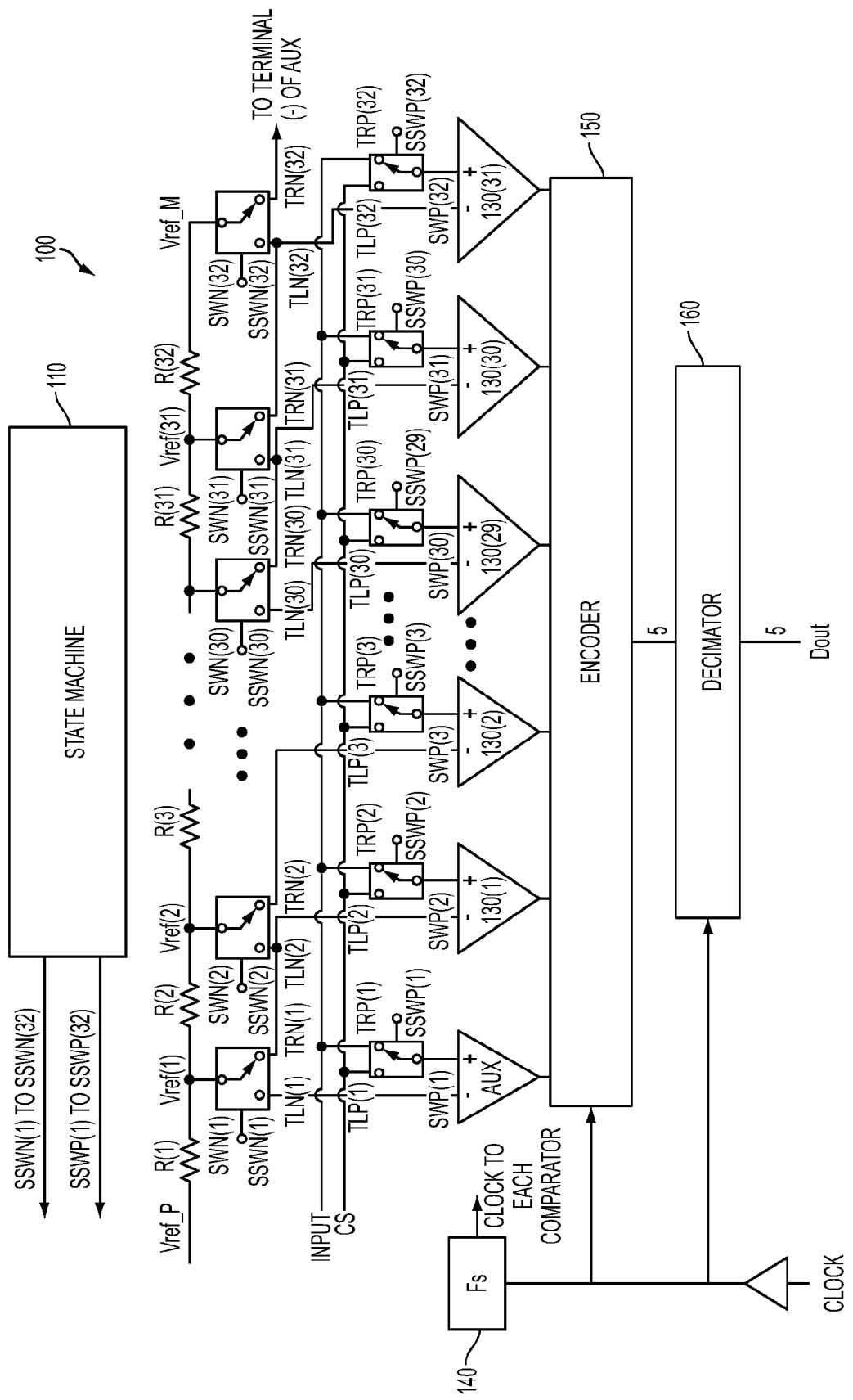
FIG. 1 shows an illustrative flash ADC upon which embodiments of the disclosure may be implemented.

Various embodiments, or examples, of the disclosure illustrated in the drawings are now being described using specific language. It will nevertheless be understood that no limitation of the scope of the invention is thereby intended. Any alterations and modifications in the described embodiments, and any further applications of principles of the disclosure described in this document are contemplated as would normally occur to one skilled in the art to which the disclosure relates. Reference numbers may be repeated throughout the embodiments, but this does not necessarily require that feature(s) of one embodiment apply to another embodiment, even if they share the same reference number.

FIG. 1 shows an exemplary flash ADC 100 upon which embodiments of the disclosure may be implemented. ADC 100 is an analog-to-digital converter commonly found in RF (radio frequency) communication applications. In general, if ADC 100 is an N-bit converter, then ADC 100 uses $2^N-1$ comparators 130 to convert signals from analog to digital. Various embodiments of the disclosure use an extra comparator 130 for a total of $2^N$ comparators 130 such that at any point in time one comparator 130 may be calibrated while the other $2^N-1$ comparators 130 continue to function as usual. In effect, each comparator 130 is in turn calibrated while the other $2^N-1$ comparators 130 continue to function. For illustration purposes, ADC 100 is shown to be a 5-bit converter and thus uses 31 ($2^5-1$) comparators 130. Various embodiments of the disclosure use an extra comparator 130 for a total of 32 (e.g., $2^5$) comparators 130 so that each comparator 130 may be in turn calibrated while the other 31 comparators 130 continue to function. Further, embodiments of the disclosure are explained in the context of a 5-bit converter, but are not limited, and applicable to N-bit converters.

Voltage Vref_P, voltage Vref_M, and the resistive divider comprising resistors R(1) to R(32) provide reference voltages Vref to each input of comparators 130. Those skilled in the art will recognize that the reference voltage Vref for each comparator 130 is one LSB (least significant bit) greater than the reference voltage for the next comparator. For example, the reference voltage Vref(1) for comparator 130(1) is one LSB greater than the reference voltage Vref(2) for comparator 130(2), and the reference voltage Vref(2) for comparator 130(2) is one LSB greater than the reference voltage Vref(3) for comparator 130(3), etc. In an embodiment, voltage Vref_P is at Vdd while Vref_M is at ground.

State machine 110 controls the order of calibration for each comparator 130, including generating signals SSWN and SSWP to activate and/or deactivate appropriate switches SWN and SWP for a comparator 130 to be calibrated or returned to normal operation. Depending on applications and design choices, comparators 130 may be calibrated in the sequence of the LSB comparator (e.g., comparator 130(1)) to the MSB comparator (e.g., comparator 130(31)) or in the sequence of the MSB comparator (e.g., comparator 130(31)) to the LSB comparator (e.g., comparator 130(1)). Alternatively, comparators 130 may be calibrated in any order as defined by the user. In the embodiment of FIG. 1, a comparator 130 is selected as an auxiliary comparator (e.g., comparator Aux), and comparators 130 are calibrated in the order from LSB to MSB. As a result, comparator Aux is first calibrated then replaces a first comparator, e.g., comparator 130(1), which becomes a new comparator Aux. This new comparator Aux is calibrated and replaces the next comparator, e.g., comparator 130(2), which becomes another new comparator Aux. This new comparator Aux is calibrated and replaces the next comparator, e.g., comparator 130(3), etc., until all comparators 130 are calibrated. During the calibration process, while comparator Aux is being calibrated the other 31 comparators 130 that are not under calibration continue to function. Depending on applications, state machine 110 may be implemented using hardware circuits including programmable logic devices or using a CPU (central processing unit) with software, and embodiments of the disclosure are not limited to any implementation method.

Signal Input serves as the normal positive input for comparators 130. Calibration signal CS serves to calibrate a comparator 130 under calibration (e.g., comparator Aux). In an embodiment signal CS including a differential signal of 0V is applied at the positive input of comparator Aux, and the output of comparator Aux is observed. If comparator Aux is un-calibrated, an offset value would appear at its output, which is then calibrated to zero volts. As a result, comparator Aux is calibrated.

A signal SSWN controls a corresponding switch SWN, which includes a left terminal TLN and a right terminal TRN.

For example, when signal SSWN(1) is activated (e.g., high), it closes switch SSWN(1) to right terminal TRN, but when it is deactivated (e.g., low), it closes switch SSWN(1) to left terminal TLN. Switches SWN in conjunction with corresponding signals SSWN control the negative input of comparators 130. Either left terminal TLN or right terminal TRN of a switch SWN is to connect the negative input of a comparator 130 to its corresponding Vref. For example, as shown in FIG. 1, left terminal TLN of switch SWN(1) is connected to the negative input of comparator Aux while right terminal TRN of switch SWN(1) is connected to the negative input of comparator 130(1). A switch SWN connects the negative input of a comparator 130 then connected to the closed position of switch SWN to its corresponding Vref. For example, as shown in FIG. 1, switch SWN(1) being closed to right terminal TRN(1) connects the negative input of comparator 130(1) to its corresponding Vref(1); switch SWN(2) being closed to right terminal TRN(2) connects the negative input of comparator 130(2) to its Vref(2); and switch SWN(3) being closed to right terminal TRN(3) connects the negative input of comparator 130(3) to its corresponding Vref(3), etc. A comparator 130 having its negative input connected to Vref is under normal operation while a comparator 130 with its negative input not connected to Vref (e.g., connected to ground) is under calibration.

A signal SSWP controls a corresponding switch SWP, which includes a left terminal TLP and a right terminal TRP. For example, when signal SSWP(1) is activated (e.g., high), it closes switch SSWP(1) to right terminal TRP, but when it is deactivated (e.g., low), it closes switch SSWP(1) to left terminal TLP. Switches SWP in conjunction with corresponding signals SSWP control the positive input of comparators 130. The left terminal TLP of a switch SWP is to connect the positive input of a comparator 130 to calibration signal CS while the right terminal TRP of the same switch SWP is to connect the positive input of a comparator 130 to signal Input. For example, as shown in FIG. 1, left terminal TLP of switches SWP is connected to calibration signal CS while right terminal TRP of switches SWP is connected to signal Input. A switch SWP connects the positive input of a comparator 130 to either calibration signal CS or signal Input. For example, as shown in FIG. 1, switch SWP(1) being closed to right terminal TRP(1) connects the positive input of comparator Aux to signal Input; switch SWP(2) being closed to right terminal TRP(2) connects the positive input of comparator 130(1) to signal Input, switch SWP(3) being closed to right terminal TRP(3) connects the positive input of comparator 130(2) to signal Input, etc. A comparator 130 having its positive input connected to signal Input is under normal operation while a comparator 130 having its positive input connected to signal CS is under calibration.

Comparators 130 generate the digital code for ADC 100. For example, a comparator 130 produces a "1" when its analog input voltage is higher than the reference voltage applied to it (e.g., its Vref), and produces a "0" otherwise. As shown in FIG. 1, when switches SWN and SWP are appropriately closed the reference voltage Vref of comparators 130 is applied to their positive terminals. Various embodiments of the disclosure calibrate one comparator (e.g., comparator Aux) while the other 31 comparators 130 function as usual. Once comparator Aux has been calibrated various embodiments swap it with another comparator 130, which now becomes a new comparator Aux. Various embodiments then calibrate the new comparator Aux and after calibrating this new comparator Aux swap this new comparator Aux with another comparator 130 that has not been calibrated, etc., until all comparators 130 are calibrated. Swapping a comparator 130 for calibration and returning it to normal operation uses the corresponding switches SWN and SWP. In an embodiment, when a comparator 130 is calibrated its negative input is connected to ground while its positive input is connected to the calibration signal CS. Conversely, when a comparator 130 is in normal operation, its negative input is connected to its Vref and its positive input is connected to signal Input. Connecting the inputs of comparators 130 to appropriate signals (e.g., Vref, signal CS, signal Input, etc.) is done through switches SWN and SWP. Comparators 130 are shown as being single-ended wherein each terminal (e.g., a negative terminal and a positive terminal) includes a single terminal, but embodiments are not limited to single-ended comparators and are also applicable to other types of comparators including double-ended or differential comparators. For example, in a differential comparator, each of a negative terminal and a positive terminal includes two terminals, e.g., a negative and a positive terminal. Additional illustration regarding differential comparators is explained with respect to FIG. 2 below.

Frequency source Fs 140 in conjunction with clock signal CLK provides the clocks for various units including comparators 130, encoder 150, decimation filter 160, etc. In various embodiments, frequency source 140 provides different clocks to comparators 130 such that a comparator 130 under calibration can run at a frequency lower than a frequency used by comparators under normal operation.

Encoder 150 transforms thermometer code generated by comparators 130 to binary code. Those skilled in the art will recognize that the thermometer code is used to verify the region including the distribution of MSB (most significant bit) and LSB (least significant bit). Decimation filter 160 attenuates out of band signal to gain better performance for ADC 100.

Figure 2:
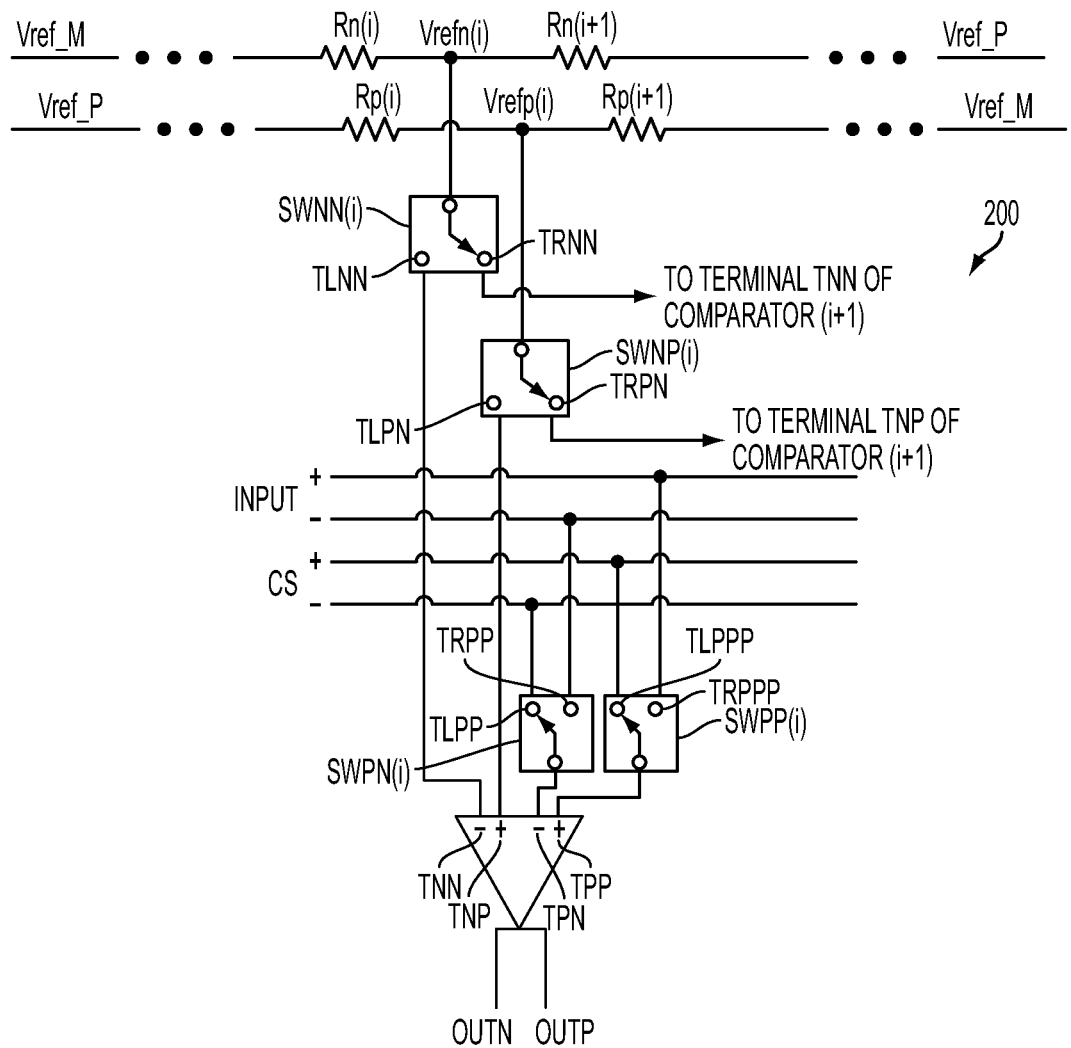
FIG. 2 illustrates differential comparators being used in the ADC in FIG. 1, in accordance with an embodiment.

FIG. 2 shows a comparator 200 illustrating a comparator 130(i), being in differential configuration, in accordance with an embodiment. Because of the differential configuration, output of comparator 200 includes a negative terminal Outn and a positive terminal Outp, and reference voltage Vref(i) for comparator 200 includes a positive polarity reference voltage Vrefp(i) and a negative polarity reference voltage Vrefn(i). A reference voltage Vrefp (e.g., reference voltage Vrefp(i)) is in fact a reference voltage having voltage Vref_P coupled to resistor R(1) and voltage Vref_M coupled to resistor R(32) as shown in FIG. 1. Voltage Vrefn is the inverse polarity of voltage Vrefp wherein voltage Vref_P is coupled to resistor R(32) and voltage Vref_M is coupled to resistor R(1). Further, the negative terminal of comparator 200 includes a negative terminal TNN and a positive terminal TNP. Similarly, the positive terminal includes a negative terminal TPN and a positive terminal TPP.

A switch SWN in FIG. 1 is shown in FIG. 2 including a switch SWNN and a switch SWNP to control corresponding terminals TNN and TNP. A switch SWNN includes a terminal TLNN and a terminal TRNN, either one of which is to connect a negative terminal TNN of a comparator 130 to its corresponding negative voltage reference Vrefn. A switch SWNP includes a terminal TLPN and a terminal TRPN, either of which is to connect a positive terminal TNP of a comparator 130 to its corresponding positive voltage reference Vrefp.

A switch SWP in FIG. 1 is shown in FIG. 2 as a switch SWPN and SWPP to control the corresponding terminals TPN and TPP. A switch SWPN includes a terminal TLPP and a terminal TRPP. A terminal TLPP is to connect terminal TPN of a comparator 130 to a negative polarity of calibration signal CS while a terminal TRPP is to connect terminal TPN of a comparator 130 to a negative polarity of signal Input. A switch SWPP includes a terminal TLPPP and a terminal TRPPP. A terminal TLPPP is to connect terminal TPP of a comparator 130 to a positive polarity of calibration signal CS while a terminal TRPPP is to connect terminal TPP of a comparator 130 to a positive polarity of signal Input.

Switches SWNN, SWNP, SWPN, and SWPP are controlled by appropriate signals generated and controlled by state machine 110. These signals, for simplicity, are not shown.

Figure 3:
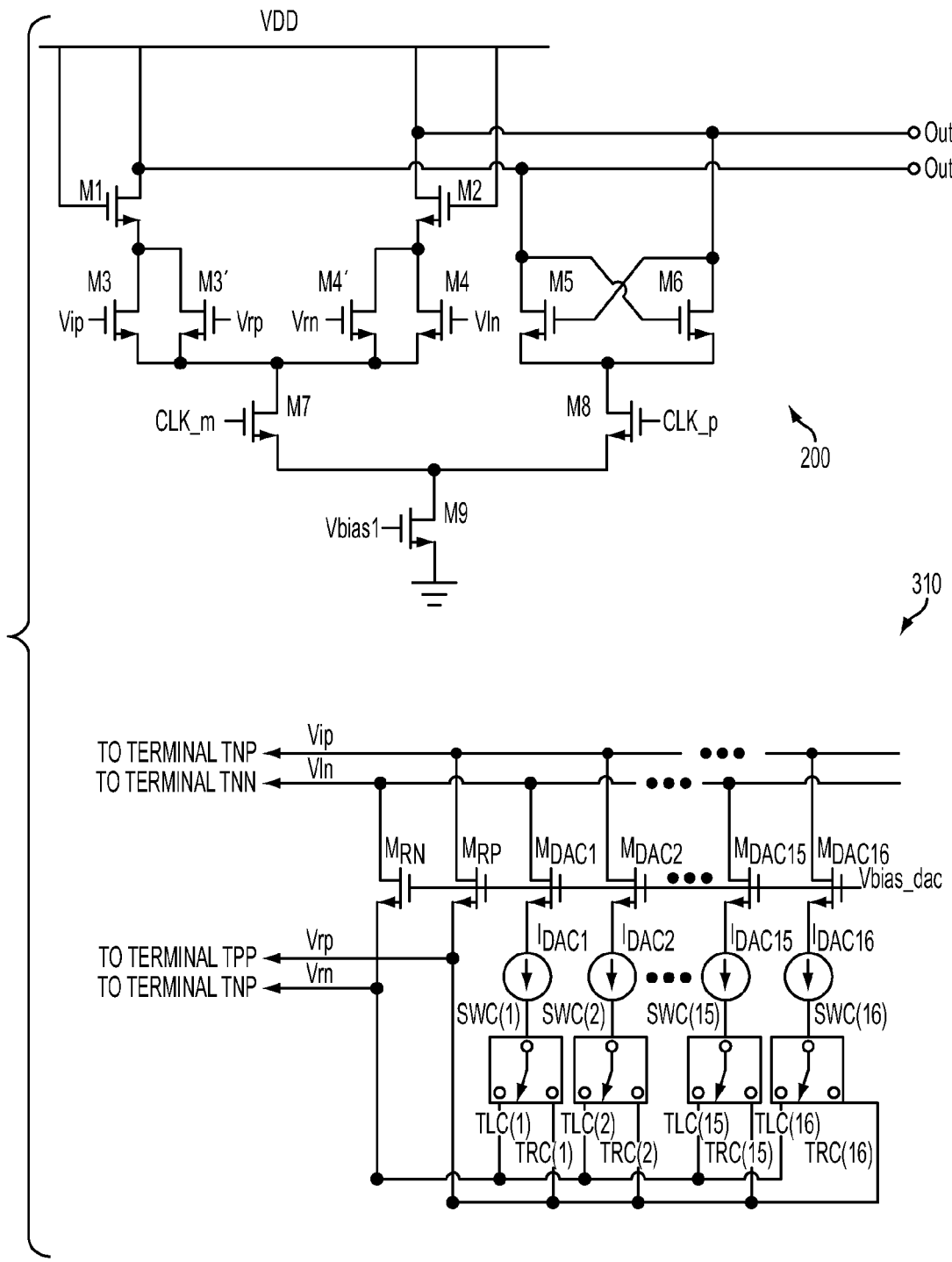
FIG. 3 shows a differential comparator of the flash ADC in FIG. 1 configured for calibration, in accordance with an embodiment.

FIG. 3 shows comparator 200 with details and being configured for calibration in accordance with an embodiment using a circuit 310 known in the art. Transistors M1, M2, M3, M3', M4, M4', M7, and M9 form a pre-amplifier for comparator 200, and transistors M5, M6, and M8 form a latch circuit. Those skilled in the art will recognize that if comparator 200 is single-ended, transistors M3' and M4' and corresponding signals Vrp and Vrn would be excluded.

Calibration signals Vip, Vin, Vrp, and Vrn are coupled to terminals TNP, TNN, TPP, and TNP as shown.

Switches SWC(1) to SWC(16) serve to calibrate transistor 200. Each switch SWC can be closed to a left terminal TLC or a right terminal TRC. In the embodiment of FIG. 300, left terminals TLC are connected to signal Vrn and the source of transistor Mrn while right terminals TRC are connected to signal Vrp and the source of transistor Mrp. In an embodiment, all switches SWC are initially connected to left terminals TLC. As a result, signal Vrn is positive while signal Vrp is negative. Each switch SWC is then switched to right terminal TRC, and signal Vrn and/or Vrp is observed. When enough switches SWC are switched from left terminals TLC to right terminals TRC, the polarity of signals Vrn and Vrp change to negative and positive respectively. At that time, if comparator 200 is un-calibrated then the outputs Voutn and Voutp of comparator 200 shows a differential or offset voltage. Various embodiments of the disclosure use a voltage offset cancellation buffer to compensate for this voltage offset, e.g., allowing it to be zero volts. As a result, comparator 200 is calibrated. Additional calibration method using circuit 310 and the voltage offset cancellation buffer may be found at IEEE 2006 Custom Integrated Circuits Conference (CICC), entitled "A 3.5 GS/s 5-b Flash ADC in 90 nm CMOS," by Sunghyun Park et al.

Figure 4:
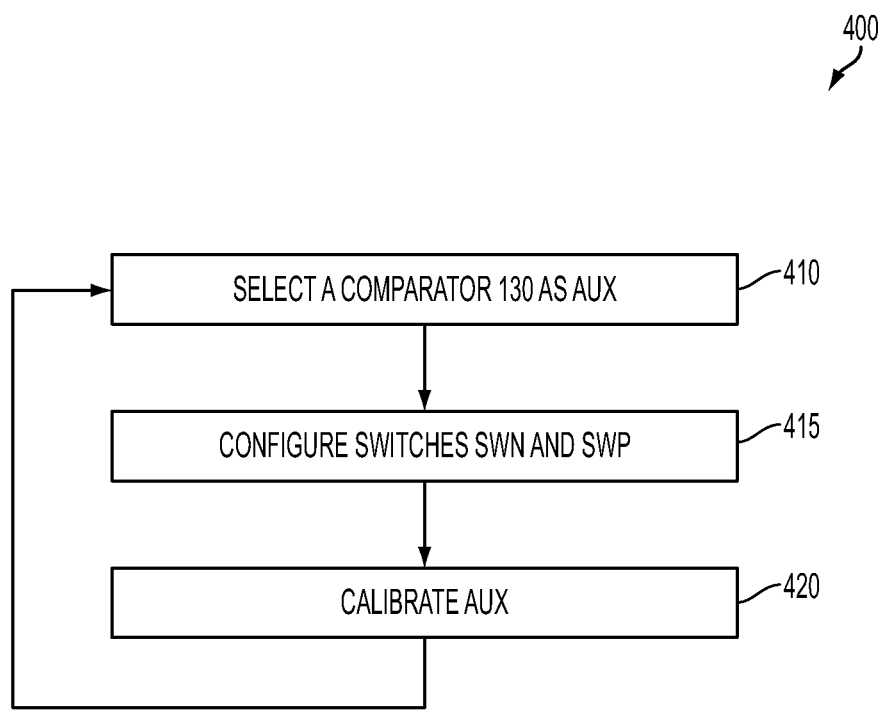
FIG. 4 shows a flow chart illustrating a method embodiment for calibrating comparators of the ADC in FIG. 1.

FIG. 4 shows a flow chart 400 illustrating a method embodiment for calibrating comparators 130.

In block 410 a comparator 130, e.g., comparator Aux, is selected for calibration. In block 415 comparator Aux is configured for calibration including controlling appropriate switches SWN and SWP so that comparator Aux is not part of ADC 100 and ready for calibration while other comparators 130(1) to 130(31) continue to operate as normal. In the embodiment of FIG. 1, switch SWN(1) closes to right terminal TRN and switch SWP(1) closes to left terminal TRL while other switches SWN and SWP remain as shown in FIG. 1, resulting in a configuration where comparators 130(1) to 130(31) continue to function as normal.

In block 420, comparator Aux is calibrated. In an embodiment, the output offset of comparator Aux is determined using circuit 310, and this output offset is calibrated to be zero using the voltage offset canceling buffer, resulting in comparator Aux being calibrated. Other methods of calibrating comparator Aux may be used.

Once comparator Aux has been calibrated another comparator 130 is selected for calibration and is referred to as a "new" comparator Aux. In effect, the method 400 returns to block 410, and blocks 415 and 420 are performed with respect to the new comparator Aux. In an embodiment, the comparators Aux at blocks 410 are in the sequential order of the LSB comparator to the MSB comparator. That is, comparators 130 are calibrated in the order of 130(1), 130(2), . . . , to 130(31).

A number of embodiments of the disclosure have been described. It will nevertheless be understood that various modifications may be made without departing from the spirit and scope of the invention. For example, there are various mechanisms to implement a switch (e.g., switch SWN, SWP, SWNN, SWNP, SWPN, SWPP, etc.), and embodiments of the disclosure are not limited to a particular method to implement a switch. Similarly, there are various mechanisms to implement a state machine (e.g., state machine 110), and embodiments of the disclosure are not limited to a particular way of implementing such a machine. The method embodiment in FIG. 4 uses a single-ended comparator for illustration, various embodiments of the disclosure are applicable to differential and other comparators. In such situations, appropriate switches SWNN, SWNP, SWPN and SWPP are configured for comparator Aux to be calibrated and returned to normal operation after calibration. The above method embodiment shows exemplary steps, but these steps are not necessarily required to be performed in the order shown. Steps may be added, replaced, changed order, and/or eliminated as appropriate, in accordance with the spirit and scope of the invention.

One aspect of this description relates to an analog-to-digital converter (ADC). The ADC includes a plurality of comparators connected to the ADC. The ADC further includes a plurality of switches, wherein switches connected to a corresponding comparator of the plurality of comparators are configured to alternate the corresponding comparator between normal operation and a calibration configuration. The ADC further includes at least one comparator of the plurality of comparators other than the corresponding comparator is configured for normal operation if the corresponding comparator is configured for calibration.

Another aspect of this description relates to an analog-to-digital converter (ADC). The ADC includes a first comparator connected to the ADC. The ADC further includes a first terminal and a second terminal connected to the first comparator. The ADC further includes a first switch coupled to the first terminal. The ADC further includes a second comparator connected to the ADC, wherein the first switch is configured to disconnect the first comparator from a reference voltage.

Still another aspect of this description relates to a method of operating an analog-to-digital converter (ADC). The method includes switching a first comparator of a plurality of comparators in the ADC to a calibration mode. The method further includes maintaining a second comparator of the plurality of comparators in a normal operation mode while the first comparator is in the calibration mode. The method further includes switching the second comparator to the calibration mode. The method further includes switching the first comparator to the normal operation mode while the second comparator is in the calibration mode.

What is claimed is:

1. An analog-to-digital converter (ADC) comprising:
   a plurality of comparators including a first comparator having a first terminal and a second terminal;
   a plurality of switches including a first switch configured to electrically connect a first reference voltage to the first terminal of the first comparator, a second switch configured to electrically connect a second reference voltage to the first terminal of the first comparator, and a third switch coupled to the second terminal of the first comparator, wherein the third switch is configured to alternate the first comparator between normal operation and a calibration operation; and a second comparator of the plurality of comparators other than the first comparator, wherein the second comparator is configured for normal operation when the first comparator is in calibration operation.

2. The ADC of claim 1, wherein the third switch is configured to selectively electrically connect a calibration signal to the first comparator.

3. The ADC of claim 1, wherein the first switch is further configured to selectively electrically connect the first reference voltage to the second comparator.

4. The ADC of claim 1, further comprising an encoder configured to receive a thermometer code from each comparator of the plurality of comparators.

5. The ADC of claim 4, wherein the encoder is configured to transform the thermometer code from each comparator of the plurality of comparators into binary code.

6. The ADC of claim 4, further comprising a decimator configured to receive an output of the encoder.

7. The ADC of claim 6, wherein the decimator is configured to attenuate out of band signals from the output of the encoder.

8. The ADC of claim 1, wherein at least one comparator of the plurality of comparators is a differential comparator.

9. An analog-to-digital converter (ADC) comprising:
    a first comparator;
    a first terminal coupled to the first comparator;
    a first switch coupled to the first terminal;
    a second switch coupled to the first terminal; and
    a third switch coupled to a second terminal of the first comparator, wherein the third switch is configured to selectively electrically connect the second terminal of the first comparator to a calibration signal, wherein
    the first switch is configured to electrically disconnect the first comparator from a first reference voltage and the second switch is configured to electrically disconnect the first comparator from a second reference voltage.

10. The ADC of claim 9, wherein the first switch is configured to selectively electrically connect a second comparator to the first reference voltage.

11. The ADC of claim 9, further comprising a third switch coupled to a first terminal of a second comparator, and wherein the first switch is coupled to the first terminal of the second comparator.

12. The ADC of claim 11, wherein the first switch is configured to selectively electrically connect the second comparator to the first reference voltage.

13. The ADC of claim 9, wherein the first comparator is a differential comparator.

14. The ADC of claim 9, further comprising an encoder configured to transform a thermometer code from the first comparator into binary code.

15. The ADC of claim 14, further comprising a decimator configured to attenuate out of band signals in the binary code.

16. A method of operating an analog-to-digital converter (ADC), the method comprising:
    switching a first comparator of a plurality of comparators in the ADC to a calibration mode;
    maintaining a second comparator of the plurality of comparators in a normal operation mode while the first comparator is in the calibration mode;
    calibrating the first comparator based on an offset value at an output of the first comparator;
    switching the second comparator to the calibration mode; and
    switching the first comparator to the normal operation mode while the second comparator is in the calibration mode.

17. The method of claim 16, wherein switching the second comparator to the calibration mode comprises disconnecting the second comparator from a reference voltage, and switching the first comparator to the normal operation comprises connecting the first comparator to the reference voltage.

18. The method of claim 16, wherein switching the second comparator to the calibration mode comprises connecting the second comparator to a calibration signal, and switching the first comparator to the normal operation comprises disconnecting the first comparator from the calibration signal.

19. The method of claim 16, wherein switching the second comparator to the calibration mode comprises:
    connecting a first terminal of the second comparator to a first calibration signal;
    connecting a second terminal of the second comparator to a second calibration signal;
    disconnecting a third terminal of the second comparator from a first reference voltage; and
    disconnecting a fourth terminal of the second comparator from a second reference voltage.

* * * * *